United States Patent
Tanaka et al.

(10) Patent No.: US 9,746,259 B2
(45) Date of Patent: Aug. 29, 2017

(54) HEAT CONDUCTOR AND DEVICE INCLUDING THE SAME

(71) Applicant: Panasonic Intellectual Property Management Co., Ltd., Osaka (JP)

(72) Inventors: Atsushi Tanaka, Osaka (JP); Naomi Nishiki, Kyoto (JP); Kazuhiro Nishikawa, Osaka (JP); Shigeki Sakaguchi, Kyoto (JP); Hidetoshi Kitaura, Osaka (JP); Kimiaki Nakaya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 214 days.

(21) Appl. No.: 14/713,306

(22) Filed: May 15, 2015

(65) Prior Publication Data
US 2015/0330724 A1    Nov. 19, 2015

(30) Foreign Application Priority Data

May 16, 2014    (JP) .................................. 2014-101926

(51) Int. Cl.
*F28F 7/00* (2006.01)
*F28F 21/02* (2006.01)
(Continued)

(52) U.S. Cl.
CPC .............. *F28F 21/02* (2013.01); *B32B 7/005* (2013.01); *B32B 27/08* (2013.01); *B32B 27/20* (2013.01);
(Continued)

(58) Field of Classification Search
CPC ......... F28F 21/02; F28F 21/065; B32B 7/005; B32B 27/08; B32B 27/20; B32B 2250/02
(Continued)

(56) References Cited

U.S. PATENT DOCUMENTS 7,168,484 B2 * 1/2007 Zhang .................... B82Y 10/00
                                                      165/104.33
7,416,019 B2 * 8/2008 Osiander ................ B82Y 30/00
                                                        165/96
(Continued)

FOREIGN PATENT DOCUMENTS

JP           4759852      6/2011
WO      2013/099089      7/2013

OTHER PUBLICATIONS

Extended European Search Report for Application No. 15167663.2 dated Sep. 25, 2015.

*Primary Examiner* — Davis Hwu
(74) *Attorney, Agent, or Firm* — Wenderoth, Lind & Ponack, L.L.P.

(57) ABSTRACT

A heat conductor includes a first layer containing a first resin component and first flake graphite fillers each having a basal plane; and a second layer containing a second resin component and second flake graphite fillers each having a basal plane. The heat conductor is a laminate including the first layer and the second layer, an average of first angles in the first layer is 35 degrees or smaller, each of the first angles is an acute angle between the basal plane of a corresponding one of the first flake graphite fillers and a first laminated surface of the laminate, an average of second angles in the second layer ranges from 55 degrees to 90 degrees, and each of the second angles is an acute angle between the basal plane of a corresponding one of the second flake graphite fillers and a second laminated surface of the laminate.

18 Claims, 2 Drawing Sheets

(51) Int. Cl.
*B32B 7/00* (2006.01)
*B32B 27/08* (2006.01)
*B32B 27/20* (2006.01)
*F28F 21/06* (2006.01)
*H05K 9/00* (2006.01)

(52) U.S. Cl.
CPC ......... *F28F 21/065* (2013.01); *H05K 9/0083* (2013.01); *B32B 2250/02* (2013.01); *B32B 2250/24* (2013.01); *B32B 2262/106* (2013.01); *B32B 2305/30* (2013.01); *Y10T 428/24058* (2015.01)

(58) Field of Classification Search
USPC ........................................................ 165/185
See application file for complete search history.

(56) References Cited

U.S. PATENT DOCUMENTS

| | | | |
|---|---|---|---|
| 8,194,407 B2* | 6/2012 | Yamaguchi | H01L 23/373 165/185 |
| 2015/0030835 A1 | 1/2015 | Tanaka et al. | |

* cited by examiner

HEAT CONDUCTOR AND DEVICE INCLUDING THE SAME

CROSS REFERENCE TO RELATED APPLICATION

The present application is based on and claims priority of Japanese Patent Application No. 2014-101926 filed on May 16, 2014. The entire disclosure of the above-identified application, including the specification, drawings and claims is incorporated herein by reference in its entirety.

BACKGROUND OF THE INVENTION

1. Field of the Invention

The present disclosure relates to a heat conductor and a device including the heat conductor, and particularly to a heat conductor in a rubber composition for shielding electromagnetic waves and to a device including the heat conductor.

2. Description of the Related Art

In recent years, electronic devices have been miniaturized and achieved greater functionality in many fields of, for example, households, offices, industries, and health care. The electromagnetic waves radiated from, for example, enclosures of electronic devices sometimes enter other electronic devices and cause the other electronic devices to malfunction.

As such, electronic devices malfunction due to electromagnetic waves from the outside. Thus, to prevent such malfunction, for example, the electronic devices are covered with electromagnetic wave shielding materials so that electromagnetic waves do not enter the electronic devices.

Conventional examples of the electromagnetic wave shielding materials include metal plates such as aluminum plates, metal-fiber wire meshes made of, for example, stainless-steel, plating films, and materials each having a surface treated to be conductive. These materials are separately used according to the application or the cost. Furthermore, the examples of the electromagnetic wave shielding materials also include a rubber material containing carbon for conductivity. This rubber material produces advantages of low cost, durability, and adding sealability to a part to which the rubber material is attached (Japanese Patent No. 4759852).

Since the electromagnetic wave shielding materials including this rubber material are used in a compressed state for a long period of time, they require not only sufficient conductivity but also excellent compression restorability as mechanical properties, that is, a low compression set. However, an electromagnetic wave shielding material containing a smaller amount of a filler for maintaining the rubber properties exhibits insufficient electromagnetic shielding effect. Thus, the electromagnetic wave shielding materials including this rubber material require the compatibility between the rubber properties and the electromagnetic shielding effect.

For example, JP 4759852 suggests that a rubber material containing a plasticizer, graphite fillers, and a reinforcing agent satisfies the compatibility between the rubber properties and the electromagnetic shielding effect.

The electromagnetic wave shielding materials including the rubber materials containing fillers linearly improve the electromagnetic shielding effect almost in proportion to the amount of the fillers. In other words, as the amount of the fillers increases, the electromagnetic shielding effect of the electromagnetic wave shielding materials is increased.

However, the increased amount of the fillers reduces the moldability of the electromagnetic wave shielding materials. As a result, the electromagnetic wave shielding materials are hardened, and the rubber elasticity decreases.

As described in JP 4759852, a composition in which graphite fillers are dispersed into a matrix of a thermoplastic resin has limitations in improvement in the electromagnetic shielding effect.

SUMMARY OF THE INVENTION

Thus, the present disclosure aims at providing a heat conductor containing graphite fillers, having electromagnetic wave properties, and having superior elasticity.

One non-limiting and exemplary embodiment provides a heat conductor including: a first layer containing a first resin component and a plurality of flake graphite fillers each having a basal plane; and a second layer containing a second resin component and the plurality of flake graphite fillers, wherein the heat conductor is a laminate including the first layer and the second layer, an average of first angles in the first layer is 35 degrees or smaller, each of the first angles being an acute angle between the basal plane of a corresponding one of the flake graphite fillers and a laminated surface of the laminate, and an average of second angles in the second layer ranges from 55 degrees to 90 degrees, each of the second angles being an acute angle between the basal plane of a corresponding one of the flake graphite fillers and the laminated surface of the laminate.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE PREFERRED EMBODIMENT

An embodiment will be described hereinafter.

Figure 1:
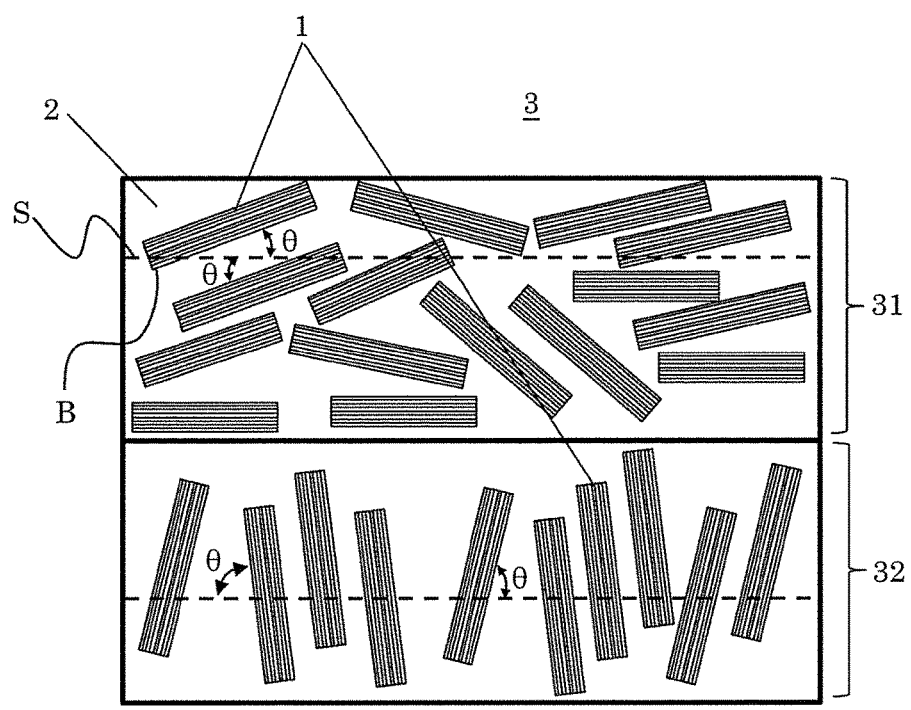
FIG. 1 is a cross-section view of a structure of a heat conductor according to an embodiment.

FIG. 1 is a cross-section view of a structure of heat conductor 3 according to an embodiment. As illustrated in FIG. 1, flake graphite fillers 1 are oriented to two directions for respective layers in matrix resin 2 of heat conductor 3. Heat conductor 3 has a double-layered structure. Here, "flake" means a thin strip or a curved plate.

Definition of Orientation Angle θ

The definition of orientation angle θ will be described hereinafter with reference to FIG. 1. Sheet surfaces abbreviated as S and indicated by dotted lines are arbitrary and parallel to the line indicating the laminated surface of heat conductor 3 (laminate). Each of the dotted lines and a line indicating a surface of flake graphite filler 1 form orientation angle θ. The surface of flake graphite filler 1 is indicated by basal plane B, and orientation angle θ may be defined as an angle between basal plane B and the laminated surface of heat conductor 3. FIG. 1 is a cross-section view of heat conductor 3. Since flake graphite fillers 1 are uniformly distributed in heat conductor 3, the same holds true for the other cross-sections of heat conductor 3.

Orientation angle θ is calculated in the following manner. A cross-section of heat conductor 3 as illustrated in FIG. 1 is observed. Next, orientation angles θ of more than 20 flake graphite fillers 1 in the cross-section are measured and averaged. The average is defined as orientation angle θ. In other words, orientation angle θ is defined as an average of the angles of all flake graphite fillers 1. The same also holds for the following angles θ.

Here, orientation angle θ is an acute angle between the intersecting lines. Thus, orientation angle θ ranges from 0 degree to 90 degrees.

The angles between surfaces vary depending on each of the cross-sections. Here, orientation angle θ is defined by averaging orientation angles θ in a cross-section.

Heat Conductor

In FIG. 1, flake graphite fillers 1 are horizontally oriented in upper layer 31 (first layer). Orientation angle θ (first angle) of flake graphite fillers 1 in upper layer 31 is 35 degrees or smaller. Such arrangement ensures the electric conductivity, and enables heat conductor 3 to exhibit the electromagnetic shielding effect as a whole. Orientation angle θ suitably falls within 30 degrees.

Setting orientation angle θ in upper layer 31 higher than 1 degree can adequately secure the number of contact points of flake graphite fillers 1, thus resulting in heat conductor 3 having higher thermal conductivity. Furthermore, setting orientation angle θ of flake graphite fillers 1 within 35 degrees enable flake graphite fillers 1 to be oriented enough to increase the thermal conductivity in a surface direction of heat conductor 3. In contrast, the thermal conductivity in a thickness direction of heat conductor 3 is suppressed. Thus, orientation angle θ needs to be set within 35 degrees to ensure the thermal conductivity.

Flake graphite fillers 1 are vertically oriented in lower layer 32 (second layer) of heat conductor 3. Orientation angle θ (second angle) in lower layer 32 ranges from 55 degrees to 90 degrees. Thus, heat conductor 3 has a compression set as a whole.

Here, flake graphite fillers 1 hardly spread across the boundary between upper layer 31 and lower layer 32 of heat conductor 3. The boundary is clearly separated at the interface between these layers. Here, upper and lower surfaces of upper layer 31 and lower layer 32 are parallel to the laminated surface of heat conductor 3 (laminate).

Flake Graphite Filler 1

Figure 2:
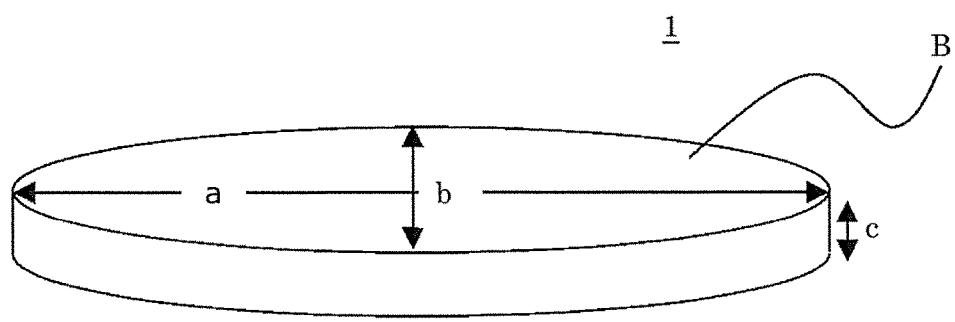
FIG. 2 is an oblique perspective view illustrating a flake graphite filler according to the embodiment.

FIG. 2 schematically illustrates flake graphite filler 1.

Longer Length "a"

As illustrated in FIG. 2, longer length "a" indicates the maximum length of flake graphite filler 1 in an arrow direction of "a" on basal plane B of flake graphite filler 1. Flake graphite fillers 1 may have a lower orientation degree in heat conductor 3 when longer length "a" is smaller than or equal to 5 μm on average in preparing heat conductor 3. When longer length "a" is larger than or equal to 300 μm on average, the dispersibility may decrease.

Shorter Length "b"

Shorter length "b" indicates the maximum length of flake graphite filler 1 perpendicular to longer length "a" on basal plane B.

Thickness "c"

Thickness "c" indicates the maximum thickness of flake graphite filler 1 in a direction vertical to basal plane B as illustrated in FIG. 2.

a/c

The ratio (a/c) of longer length "a" to thickness "c" of flake graphite filler 1 is suitably 30 or higher on average. When a/c is smaller than 30 on average, the number of contact points between flake graphite fillers 1 is reduced, and the thermal conductivity decreases.

a/b

Furthermore, when shorter length "b" indicates the maximum length of flake graphite filler 1 perpendicular to longer length "a" on basal plane B, an average ratio (a/b) of longer length "a" to shorter length "b" suitably ranges from 1 to 30. When the average ratio of a/b exceeds 30, the shape of flake graphite fillers 1 in heat conductor 3 cannot be maintained.

Flake graphite fillers 1 having such a shape have suitable contacts in-between, and the thermal conductivity increases. However, the shape of flake graphite filler 1 described above is an example, and not necessarily limited to this.

When flake graphite fillers have such a unique shape and are oriented in one direction, it is highly possible that flake graphite fillers 1 may be in contact with each other. Furthermore, the contact areas of flake graphite fillers may increase. Thus, the conductive path can be efficiently formed, and the electromagnetic shielding effect can be increased.

Heat Conductor 3

When orientation angle θ between basal plane B and the surface direction of heat conductor 3 is set within 35 degrees on average, higher electromagnetic shielding effect can be observed.

When orientation angle θ is set from 55 degrees to 90 degrees on average, flake graphite fillers 1 function as a spring in the rubber composition, and becomes a rubber molded product having a compression set.

The rubber molded product exhibiting the higher electromagnetic shielding effect and having a better compression set can be obtained by laminating layers oriented in two directions, as upper layer 31 and lower layer 32 of heat conductor 3 in FIG. 1.

Flake graphite fillers 1 in each of upper layer 31 and lower layer 32 are set to account for more than 50% to 80% of heat conductor 3 by mass. The layers with such content exhibit the high electromagnetic shielding effect and have a compression set.

When flake graphite fillers 1 in upper layer 31 account for 50% or lower of heat conductor 3 by mass, the amount of flake graphite fillers 1 for electromagnetic shielding is insufficient, and the electromagnetic shielding effect may decrease. When flake graphite fillers 1 in upper layer 31 account for 80% or higher of heat conductor 3 by mass, the amount of flake graphite fillers 1 in the resulting polymer is excessive, and the polymer becomes very brittle.

When flake graphite fillers 1 in lower layer 32 account for 50% or lower of heat conductor 3 by mass, the amount of flake graphite fillers 1 that produce restoring force against compression is insufficient, and the compression set becomes poor. When flake graphite fillers 1 in lower layer 32 account for 80% or higher of heat conductor 3 by mass, the resulting polymer becomes very brittle as upper layer 31.

The two layers in heat conductor 3 may be any as long as the proportion of upper layer 31 to lower layer 32 in thickness ranges from 40% to 60%. When the proportion of upper layer 31 falls below 40% or exceeds 60%, the electromagnetic shielding effect and the compression properties becomes unbalanced and incompatible.

Such properties can be exhibited when upper layer 31 and lower layer 32 are laminated (compressed) with the same surface area. Upper layer 31 may be larger than lower layer 32 in the other portions to dissipate heat.

Figure 3:
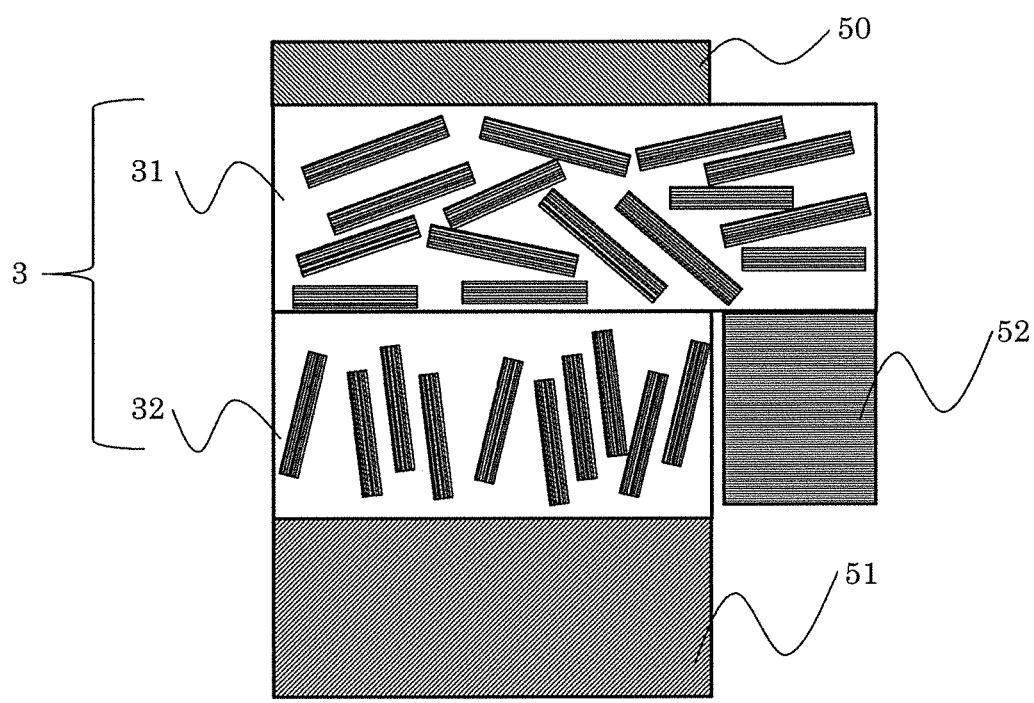
FIG. 3 is a cross-section view of another structure of a heat conductor according to the embodiment.

For example, FIG. 3 is a cross-section view of such a case. Heat conductor 3 is disposed between lid 50 and main unit 51. Upper layer 31 is larger than lower layer 32, and the edge portion of upper layer 31 is connected to heat dissipator 52.

Since upper layer 31 protrudes in the portion other than the laminated (compressed) portion, the heat can be dissipated into heat dissipator 52.

The thicknesses of upper layer 31 and lower layer 32 are changed depending on the respective positions. However, each of upper layer 31 and lower layer 32 requires a thickness of at least 1 mm to fulfill their functions.

Although the ratio of upper layer 31 to lower layer 32 in thickness is suitably 1:1, the quotient of upper layer 31 may range from 0.5 to 2.

Heat conductor 3 is suitable as a shielding material to prevent malfunction of an electronic device caused by the electromagnetic waves from the outside, that is, electromagnetic interference (EMI).

Method for Preparing Flake Graphite Fillers 1

The constituent elements of heat conductor 3 according to the embodiment will be more specifically described hereinafter.

Flake graphite fillers whose longer length "a" ranges from 5 μm to 300 μm and a/c ratio is 30 or higher on average can be obtained by, for example, milling a graphite film. Alternatively, natural graphite may be processed into flakes whose longer length "a" ranges from 5 μm to 300 μm and a/c ratio is 30 or higher on average. Flake graphite fillers 1 of one kind may be solely used, or flake graphite fillers 1 obtained by mixing multiple kinds may be used as long as longer length "a" and the a/c ratio satisfy the above conditions.

The graphite film can be obtained by graphitizing a polymer film through sintering it at a temperature of 2,400° C. or higher and suitably 2,600° C. to 3,000° C. in an inert gas atmosphere. The graphite film may be sintered in a single step or in two or more steps by changing the respective temperatures. Suitable examples of the inert gas include nitrogen or argon due to the low cost. Suitable examples of the sintering time include a period from 2 hours to 6 hours.

The thickness of the polymer film to be graphitized may be selected as appropriate in accordance with thickness "c" of flake graphite fillers 1. Examples of the thickness include 400 μm or smaller and suitably ranging from 10 μm to 200 μm. When a comparatively thick polymer film is graphitized as a starting material and the resulting graphite film is milled, the graphite layers exfoliate. Thus, thinner flake graphite fillers can be obtained.

If the polymer film has a thickness larger than 400 μm, heat is less likely to be evenly applied to the film, thus reducing the crystallinity of the graphite. If the polymer film has a thickness smaller than 10 μm, the film is broken by the heat treatment.

Examples of suitable materials of the polymer film include polyimide, polyamide-imide, polyoxadiazole, polybenzothiazole, polybenzobisthiazole, polybenzoxazole, polybenzobisthiazole, polyphenyleneisophthalamide, poly (m-phenylene benzimidazole), poly(phenylenebenzobisimidazole), polythiazole, and polyparaphenylene vinylene. These materials are, for example, formed into films.

The preparation method is not particularly limited to the above. These materials may be used singly or in a combination of two or more. For example, two or more different kinds of the films may be graphitized, milled, and then mixed; or two or more different kinds of the materials that are conjugated or alloyed in advance may be formed into films and then graphitized. Particularly, graphite having superior properties can be obtained from polyimide films.

The obtained graphite film is milled into flake graphite fillers. Suitable examples of the milling method include making graphite fillers to collide against one another or physically collide against a hard material serving as a medium. Examples of the method also include ball milling, nanomizing, and jet milling.

The thickness of the graphite film to be milled may be selected as appropriate in accordance with thickness "c" of desired flake graphite fillers.

In processing natural graphite, the natural graphite is suitably pretreated by having it immersed in sulfuric acid and then heated, thereby causing the graphite layers to expand. After such pretreatment, shear force is applied to the expanded graphite, thereby accelerating exfoliation of the layers. As a result, flake graphite fillers having a higher a/c ratio can be easily obtained.

Matrix Resin 2

Example components of matrix resin 2 include various thermoplastic resins and elastomers. Alternatively, a mixture of a thermoplastic resin having no rubber elasticity and an elastic elastomer may be used as matrix resin 2. Particularly, the elastic elastomer is suitably used as matrix resin 2.

Examples of the thermoplastic resin include: styrene polymers such as styrene-acrylonitrile copolymer, styrene-maleic anhydride copolymer, and (meth)acrylic acid ester-styrene copolymer; rubber toughened polymers such as acrylonitrile butadiene styrene (ABS) and acrylonitrile-Ethylene-Styrene (AES) resins; olefin polymers such as polyethylene, polypropylene, ethylene-vinyl acetate copolymer, ethylene-vinyl alcohol copolymer, and chlorinated polyethylene; vinyl chloride polymers such as polyvinyl chloride, ethylene-vinyl chloride polymer, and polyvinylidene chloride; (meth)acrylic acid ester polymers such as polymethyl methacrylate; imide polymers such as polyamide, polyimide, polyamide-imide, and polyether-imide; polyester polymers such as polyethylene terephthalate and polybutylene terephthalate; polyacetal; polycarbonate; polyarylate; polyphenylene ether; polyphenylene sulfide; fluororesins such as polytetrafluoroethylene and polyvinylidene fluoride; ketone polymers such as polyetherketone and polyether ether ketone; sulfone polymers such as polysulfone and polyethersulfone; urethane polymers; and polyvinyl acetate. These materials may be used singly or in a combination of two or more. Furthermore, some of these materials may be alloyed.

Examples of the elastomer include chloroprene rubber, isoprene rubber, natural rubber, styrene-butadiene rubber, butadiene rubber, butyl rubber, ethylene propylene rubber, ethylene propylene diene monomer (M-class) (EPDM) rubber, nitrile rubber, urethane rubber, acrylic rubber, silicone rubber, fluorine rubber, and hydrogenated nitrile rubber. These materials may be used singly or in a combination of two or more.

Additives

Heat conductor 3 of the embodiment may include various additives, in addition to flake graphite fillers 1 and matrix resin 2. Various additives are used, particularly when heat conductor 3 is a rubber composition including an elastomer. Examples of the additives for the rubber composition include a crosslinker for crosslinking the rubber components, a carbon black (e.g., Ketjen black, acetylene black) for improving the mechanical strength of the rubber components, and a plasticizer to be used in moderate amount for adjusting rubber hardness. In addition, the other additives including a vulcanizing agent such as stearic acid, an antidegradant, oil, a lubricant, and inorganic fillers (e.g., silica fillers, alumina fillers) can be added to the anisotropic heat conductive compositions as appropriate. Furthermore, the examples of the additives include a flame retardant.

Examples of the crosslinker include a sulfur crosslinker (vulcanizing agent) and a peroxide. The crosslinker is suitably added to the anisotropic heat conductive compositions in moderate amount. When a silicone rubber is used in matrix resin 2, a curing agent for curing silicone (e.g., tertiary amines) is suitably added. Moreover, curing accelerators including zinc oxide and active zinc oxide may be added to the anisotropic heat conductive compositions in moderate amount.

Examples of the flame retardant include an organic flame retardant, an inorganic flame retardant, and a reactive flame retardant. The retardants may be used singly or at least two of the retardants may be combined. Examples of the organic flame retardant include: halogen flame retardants such as a brominated epoxy compound, a brominated alkyltriazine compound, a brominated bisphenol epoxy resin, a brominated bisphenol phenoxy resin, a brominated bisphenol polycarbonate resin, a brominated polystyrene resin, a brominated crosslinked polystyrene resin, a brominated bisphenol cyanurate resin, a brominated polyphenylene ether, a decabromodiphenyl oxide, tetrabromobisphenol A, and an oligomer thereof; phosphoric acid esters such as trimethyl phosphate, triethyl phosphate, tripropyl phosphate, tributyl phosphate, tripentyl phosphate, trihexyl phosphate, tricyclohexyl phosphate, triphenyl phosphate, tricresyl phosphate, trixylenyl phosphate, cresyl diphenyl phosphate, dicresyl phenyl phosphate, dimethyl ethyl phosphate, methyl dibutyl phosphate, ethyl dipropyl phosphate, and hydroxyphenyl diphenyl phosphate; compounds obtained by denaturing these phosphoric acid esters by various substituents; various condensed phosphoric acid ester compounds; phosphorous flame retardants such as phosphazene derivatives including phosphorus and nitrogen; and polytetrafluoroethylene.
The retardants may be used singly or at least two of the retardants may be combined.

Examples of the inorganic flame retardant include aluminum hydroxide, antimony oxide, magnesium hydroxide, zinc borate, a zirconium compound, a molybdenum compound, zinc stannate, guanidine salt, a silicone compound, and a phosphazene compound. The retardants may be used singly or at least two of the retardants may be combined.

Examples of the reactive flame retardant include tetrabromobisphenol A, dibromophenol glycidyl ether, brominated aromatic triazine, tribromophenol, tetrabromophthalate, tetrachlorophthalic anhydride, dibromoneopentyl glycol, poly(pentabromobenzyl polyacrylate), chlorendic acid (HET acid), chlorendic anhydride (HET anhydride), brominated phenol glycidyl ether, and dibromocresyl glycidyl ether. The retardants may be used singly or at least two of the retardants may be combined.

The amount of the additives is suitably 30% or lower of the total amount of heat conductor 3 by mass. This is because the moderate amount of the additives maintains the quantitative balance between flake graphite fillers 1 and matrix resin 2, thus enabling heat conductor 3 to easily maintain satisfactory heat conductivity and to easily secure the moldability and the strength.

Method of Preparing Heat Conductor 3

First, heat conductor 3 is prepared. The preparation method may be any as long as the components of matrix resin 2, flake graphite fillers 1, and the additives if necessary that are to be included in the anisotropic heat conductive composition are blended and kneaded in an appropriate order.

However, when the elastomer (rubber component) is used as a resin component, it is suitable that materials except the rubber crosslinking agent are first kneaded and then, the agent is added to avoid progression of the crosslinking of the rubber by the heat generated during the kneading.

The raw materials are kneaded in, for example, roll milling. In the roll milling, the anisotropic heat conductive compositions pass through a gap between a pair of rollers to form heat conductors. As the anisotropic heat conductive compositions are sandwiched between the rollers and pass through the gap therebetween, shear force produced by the rotating rollers is applied to the compositions, and the compositions are elongated in a direction parallel to the rotating direction of the rollers. Along with the elongation of matrix resin 2, flake graphite fillers 1 dispersed in the anisotropic heat conductive composition become oriented in the same direction.

As a result, basal planes B of flake graphite fillers 1 are successfully oriented in the surface direction of heat conductor 3. Increasing the degree of orientation of flake graphite fillers 1 requires heat conductor 3 to pass through the rollers multiple times. Moreover, when heat conductor 3 sticks onto one of the rollers when coming out from the rollers, heat conductor 3 is suitably separated from that roller, reversed, and then passes through the rollers again.

Before kneading the anisotropic heat conductive composition in the roll milling, the raw materials may be pre-kneaded by known kneaders, for example, a twin screw extruder, a single screw extruder, a twin or single screw feeder capable of applying heat, a feeder ruder, a Banbury mixer, and a roll mill.

Next, the anisotropic heat conductive composition is molded into heat conductor 3 with an intended thickness. The manner of molding heat conductor 3 is not particularly limited, as long as the thickness of heat conductor 3 can be adjusted. Here, calendaring can produce a sufficient pressure to heat conductor 3 in the thickness direction. Furthermore, such a process enables basal planes B of flake graphite fillers 1 to be oriented in the surface direction of heat conductor 3. Thus, the calendaring is suited to molding heat conductor 3.

In the calendaring, the anisotropic heat conductive composition is continuously fed to at least a pair of rollers to form heat conductors 3. Then, heat conductors 3 are wound up by a wind-up roll. Thus, the calendaring is suited to continuous production. The thickness of heat conductor 3 can be made more precise by hot rolling and then cold rolling the anisotropic heat conductive compositions in a preliminary process.

Alternatively, the anisotropic heat conductive compositions may be extruded after it is sufficiently kneaded by an internal batch mixer such as a Banbury mixer. In the extrusion, a anisotropic heat conductive compositions are continuously pushed out of a metal nozzle or a die that matches with the shape of heat conductor 3, thereby to form heat conductor 3. During the extrusion, shear force is applied to the anisotropic heat conductive composition in the extrusion direction, thus causing basal planes B of flake graphite fillers 1 to be oriented in the surface direction of heat conductor 3. Extruded heat conductor 3 may further be pressed between calendar rolls.

When the anisotropic heat conductive composition includes a rubber component, it is heated as necessary to promote the crosslinking (vulcanization) by the crosslinker, thereby to obtain heat conductor 3 with excellent flexibility and strength. Thereafter, heat conductor 3 is cut in a direction perpendicular to its plane and rotated 90 degrees, thereby to obtain heat conductor 3 in which flake graphite fillers 1 are oriented in the thickness direction.

When heat conductor 3 in FIG. 1 is prepared, upper layer 31 in FIG. 1 is first prepared in the above methods. Here, crosslinking the rubber component is stopped during the reaction.

Then, lower layer 32 of heat conductor 3 in which flake graphite fillers 1 are vertically oriented is laminated on upper layer 31. Finally, lower layer 32 and upper layer 31 are heated to produce heat conductor 3 (FIG. 1) having different two orientation directions of flake graphite fillers 1.

EXAMPLES

Examples 1 and 2

(i) Preparing Flake Graphite Fillers 1

A polyimide film (Kapton film manufactured by Du Pont-Toray Co., Ltd.) 25 μm in thickness was heat treated for 4 hours at 2,600° C. in an argon gas atmosphere, thereby to obtain a graphite film. The obtained graphite film was then milled by a jet mill for 15 minutes. The number of rotations by the classifier during the milling was 7,000. As a result, flake graphite fillers 1 each having the following shape were obtained. The longer length "a" was 17 μm on average.

(ii) Preparation of Heat Conductor 3

Obtained flake graphite fillers 1, EPDM (Esprene manufactured by Sumitomo Chemical Co., Ltd.), a peroxide serving as a crosslinker, and stearic acid were mixed together. The resultant mixture was sufficiently kneaded by a two-roll mixer with 8-inch diameter rollers to prepare heat conductor 3; meanwhile, flake graphite fillers 1 in the anisotropic heat conductive composition were oriented in the surface direction.

Table 1 shows the obtained anisotropic heat conductive compositions. The anisotropic heat conductive compositions were further heated at 170° C. for five minutes to accelerate the vulcanization. Then, the anisotropic heat conductive compositions oriented in the horizontal and thickness directions were bonded together and heated at 170° C. for five minutes to form heat conductors 3. Table 1 also shows the evaluation results.

Comparative Examples 1 and 2

The anisotropic heat conductive compositions were prepared and molded according to the conditions in Table 1, as Examples 1 and 2. In each of Examples 1 to 6, heat conductor 3 includes two layers, that is, upper layer 31 in which flake graphite fillers 1 are oriented within 35 degrees with respect to a horizontal (surface) direction of heat conductor 3 and lower layer 32 in which flake graphite fillers 1 are oriented within a range from 55 degrees to 80 degrees with respect to the same. Heat conductor 3 in each of comparative examples 1 and 2 is a single layer. Upper layer 31 and lower layer 32 each have a thickness of 2 mm.

TABLE 1

|  | EXAMPLE | | | | | | COMPARATIVE EXAMPLE | |
| --- | --- | --- | --- | --- | --- | --- | --- | --- |
|  | 1 | 2 | 3 | 4 | 5 | 6 | 1 | 2 |
| AMOUNT OF GRAPHITE | 60 | 70 | 60 | 70 | 60 | 60 | 70 | 70 |
| ORIENTATION DEGREE (°) (UPPER LAYER 31/LOWER LAYER 32) | 10/80 | 10/80 | 30/60 | 30/60 | 35/80 | 10/55 | 10 (SINGLE LAYER) | 80 (SINGLE LAYER) |
| SHIELDING EFFECT (DB) | 34 | 50 | 30 | 50 | 27 | 30 | 60 | 20 |
| COMPRESSION SET (%) | 20 | 23 | 22 | 25 | 20 | 27 | 40 | 13 |
| ACCEPTABILITY | ✓+ | ✓+ | ✓+ | ✓+ | ✓ | ✓ | x | x | x FAIL
✓ ACCEPTABLE
✓+ EXCELLENT

Evaluation of Properties (1) Shielding Effect

The shielding effect of obtained heat conductors 3 was measured by a waveguide method. The samples of 1 mm in thickness were measured in a frequency range from 18 GHz to 25 GHz, and evaluated at a frequency of 20 GHz. Heat conductors 3 of 25 dB or higher were accepted as exhibiting the shielding effect. Heat conductors 3 lower than 25 dB do not exhibit the shielding effect. Thus, the electromagnetic waves radiated from other electronic devices enter the current device and cause the device to malfunction.

(2) Compression Set

The compression set was measured at 70° C. after 100 hours in accordance with JIS K 6262. Heat conductors 3 having a compression set within 30% were accepted. When heat conductors 3 having a compression set exceeding 30% are used as gaskets or others, the restoring force and the shielding effect are lost.

(3) Acceptability

Since heat conductor 3 in Example 5 marginally satisfies the criterion on the shielding effect, it was marked ✓. Since heat conductor 3 in Example 6 marginally satisfies the criterion on the compression set, it was marked ✓. Since heat conductors 3 in Examples 1 to 4 sufficiently satisfy the criteria, they were marked √+.

Study of Results

Table 1 indicates that heat conductor 3 in which flake graphite fillers 1 are horizontally oriented in Comparative example 1 exhibited the higher shielding effect. However, heat conductor 3 of Comparative example 1 exhibited a poor compression set. Conversely, heat conductor 3 in which flake graphite fillers 1 are vertically oriented in Comparative example 2 exhibited a better compression set. However, heat conductor 3 of Comparative example 2 exhibited the poor shielding effect.

In contrast, heat conductors 3 including upper layer 31 and lower layer 32 according to Examples 1 to 6 each exhibited the higher shielding effect and a better compression set.

Specifically, heat conductors 3 including (i) upper layer 31 in which flake graphite fillers 1 are oriented within a range from 10 degrees to 35 degrees and (ii) lower layer 32 in which flake graphite fillers 1 are oriented within a range from 55 degrees to 80 degrees with respect to the horizontal (surface) direction according to Examples 1 to 6 satisfy both of the properties.

According to Table 1, as orientation angle θ in upper layer 31 is smaller, the electromagnetic shielding effect is increased. Conversely, as orientation angle θ in lower layer 32 is larger, a better compression set is obtained.

Thus, heat conductor 3 having a structure of two layers, that is, upper layer 31 in which flake graphite fillers 1 are oriented within the range from 10 degrees to 35 degrees and lower layer 32 in which flake graphite fillers 1 are oriented within the range from 55 degrees to 80 degrees satisfy both of the properties.

Lower layer 32 in which flake graphite fillers 1 are oriented within the range from 55 degrees to 80 degrees and even up to 90 degrees exhibits a compression set, because higher orientation angle θ results in a better compression set. Furthermore, orientation angle θ of flake graphite fillers 1 in upper layer 31 is suitably closer to 0 degree or 1 degree or higher. When orientation angle θ in upper layer 31 is set to 0 degree, the graphite particles are excessively aligned, and the thermal conductivity decreases.

Preparing heat conductors 3 each obtained by laminating the respective layers succeeded in having the two properties of the electromagnetic shielding effect and a compression set.

Note

Although the dimensions of flake graphite fillers 1 are averaged in the Specification, when the number of flake graphite fillers 1 is less and at least one of flake graphite fillers 1 satisfies the dimensions defined above, the present disclosure holds.

Heat conductor 3 having the two layers may have more than two layers. In other words, heat conductor 3 may be any as long as it has at least two kinds of layers.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The electromagnetic shielding effect and having a compression set are compatible in the heat conductor according to the present disclosure. Thus, the heat conductor is suitable for sealants. The expectation based on such properties is that the heat conductor is applicable to fiber-reinforced components, heat dissipating components, phase change components, photoluminescent pattern components, gas barrier components, conductive components, insulating components, components of low linear expansion coefficients, and methods for manufacturing these components.

What is claimed is:

1. A heat conductor comprising:
a first layer containing a first resin component and first flake graphite fillers each having a basal plane; and
a second layer containing a second resin component and second flake graphite fillers each having a basal plane,
wherein the heat conductor is a laminate including the first layer and the second layer,
wherein an average of first angles in the first layer is 35 degrees or smaller, each of the first angles being an acute angle between the basal plane of a corresponding one of the first flake graphite fillers and a first laminated surface of the laminate,
wherein an average of second angles in the second layer ranges from 55 degrees to 90 degrees, each of the second angles being an acute angle between the basal plane of a corresponding one of the second flake graphite fillers and the second laminated surface of the laminate,
wherein each of the first flake graphite fillers satisfies a ratio of a/c higher than or equal to 30 and "a" ranges from 1 μm to 300 μm on average, where "a" denotes a maximum length of the first flake graphite filler on the basal plane of the first flake graphite filler, and "c" denotes a maximum thickness of the first flake graphite filler, the maximum thickness of the first flake graphite filler being vertical to the basal plane of the first flake graphite filler, and
wherein each of the second flake graphite fillers satisfies a ratio of a/c higher than or equal to 30 and "a" ranges from 1 μm to 300 μm on average, where "a" denotes a maximum length of the second flake graphite filler on the basal plane of the second flake graphite filler, and "c" denotes a maximum thickness of the second flake graphite filler, the maximum thickness of the second flake graphite filler being vertical to the basal plane of the second flake graphite filler.

2. The heat conductor according to claim 1, wherein upper and lower surfaces of the first layer are parallel to the first laminated surface of the laminate and upper and lower surfaces of the second layer are parallel to the second laminated surface of the laminate.

3. The heat conductor according to claim 1, wherein the first layer and the second layer are separated at an interface.

4. The heat conductor according to claim 1, wherein the average of the first angles is 30 degrees or smaller.

5. The heat conductor according to claim 1, wherein the average of the second angles is 80 degrees or smaller.

6. The heat conductor according to claim 1, wherein the first flake graphite fillers and the second flake graphite fillers account for more than 50% to 80% of the heat conductor by mass.

7. A heat conductor comprising:
a first layer containing a first resin component and first flake graphite fillers each having a basal plane; and
a second layer containing a second resin component and second flake graphite fillers each having a basal plane,
wherein the heat conductor is a laminate including the first layer and the second layer,
wherein an average of first angles in the first layer is 35 degrees or smaller, each of the first angles being an acute angle between the basal plane of a corresponding one of the first flake graphite fillers and a first laminated surface of the laminate,
wherein an average of second angles in the second layer ranges from 55 degrees to 90 degrees, each of the second angles being an acute angle between the basal plane of a corresponding one of the second flake graphite fillers and a second laminated surface of the laminate,
wherein each of the first flake graphite fillers satisfies a ratio of a/b ranging from 1 to 20 on average, where "a" denotes a maximum length of the first flake graphite filler on the basal plane of the first flake graphite filler, and "b" denotes a maximum length of the first flake graphite filler perpendicular to "a" on the basal plane of the first flake graphite filler, and
wherein each of the second flake graphite fillers satisfies a ratio of a/b ranging from 1 to 20 on average, where "a" denotes a maximum length of the second flake graphite filler on the basal plane of the second flake graphite filler, and "b" denotes a maximum length of the second flake graphite filler perpendicular to "a" on the basal plane of the second flake graphite filler.

8. The heat conductor according to claim 1,
wherein each of the first flake graphite fillers and the second flake graphite fillers is a heat-treated polymer film.

9. The heat conductor according to claim 8,
wherein the heat-treated polymer film is a polyimide film.

10. A device comprising:
a lid;
a main unit; and
the heat conductor according to claim 1, wherein the heat conductor is between the lid and the main unit.

11. The heat conductor according to claim 7,
wherein upper and lower surfaces of the first layer are parallel to the first laminated surface of the laminate and upper and lower surfaces of the second layer are parallel to the second laminated surface of the laminate.

12. The heat conductor according to claim 7,
wherein the first layer and the second layer are separated at an interface.

13. The heat conductor according to claim 7,
wherein the average of the first angles is 30 degrees or smaller.

14. The heat conductor according to claim 7,
wherein the average of the second angles is 80 degrees or smaller.

15. The heat conductor according to claim 7,
wherein the first flake graphite fillers and the second flake graphite fillers account for more than 50% to 80% of the heat conductor by mass.

16. The heat conductor according to claim 7,
wherein each of the first flake graphite fillers and the second flake graphite fillers is a heat-treated polymer film.

17. The heat conductor according to claim 16,
wherein the heat-treated polymer film is a polyimide film.

18. A device comprising:
a lid;
a main unit; and
the heat conductor according to claim 7, wherein the heat conductor is between the lid and the main unit.

* * * * *